(12) United States Patent
Keele, Jr.

(10) Patent No.: US 7,555,081 B2
(45) Date of Patent: Jun. 30, 2009

(54) LOG-SAMPLED FILTER SYSTEM

(75) Inventor: D. Broadus Keele, Jr., Bloomington, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 605 days.

(21) Appl. No.: 11/263,452

(22) Filed: Oct. 31, 2005

(65) Prior Publication Data

US 2006/0109941 A1     May 25, 2006

Related U.S. Application Data

(60) Provisional application No. 60/623,388, filed on Oct. 29, 2004.

(51) Int. Cl.
*H04B 1/10* (2006.01)
(52) U.S. Cl. .................................... 375/350
(58) Field of Classification Search ................ 375/143, 375/152, 343, 350; 370/290, 291; 379/390.02; 455/213, 339; 708/314
See application file for complete search history.

(56) References Cited

U.S. PATENT DOCUMENTS

| | | | |
|---|---|---|---|
| 5,272,656 A | 12/1993 | Genereux | 364/724.19 |
| 5,732,002 A | 3/1998 | Lee et al. | 364/724.1 |
| 5,835,731 A * | 11/1998 | Werner et al. | 375/235 |
| 5,841,811 A * | 11/1998 | Song | 375/235 |
| 5,886,749 A * | 3/1999 | Williams et al. | 348/614 |
| 6,680,972 B1 | 1/2004 | Liljeryd et al. | 375/240 |
| 7,158,578 B2 * | 1/2007 | Khlat | 375/261 |
| 7,321,913 B2 | 1/2008 | McGrath | 708/300 |

OTHER PUBLICATIONS

Keele, D.B., Jr., "Log Sampling in Time and Frequency: Preliminary Theory and Application," AES 97th Conv., San Francisco, CA Nov. 10-13, 1994.
Y. Huang et al, "Artifactual Log-Periodicity in Finite Size Data: Relevance for Earthquake Aftershocks," JGR, Dec. 1999, JB99-0531.
Keele, D.B., Jr., "Interpolating Linear-and Log-Sampled Convolution," Audio Engineering Society Convention Paper, Presented at the 117$^{th}$ Convention, San Francisco, CA, Oct. 28-31, 2004.
Weisstein, Eric W., "Moore-Penrose Matrix Inverse." From *MathWorld*—A Wolfram Web Resource. http://mathworld.wolfram.com/Moore-PenroseMatrixinverse.html Retrieved Apr. 14, 2009.

* cited by examiner

*Primary Examiner*—Sam K Ahn
(74) *Attorney, Agent, or Firm*—Brinks Hofer Gilson & Lione

(57) ABSTRACT

This invention provides a filter system which may be implemented with less hardware and software resources than traditional filters. In addition, the filter system structure reduces the complexities typically associated with filter design by permitting direct specification of the filter frequency response. Thus, the filter system may adaptively change the filter frequency response on the fly without incurring excessive time or computational costs. The filter system may provide a filtered signal output to any subsequent processing system, such as a voice recognition system or audio reproduction system.

44 Claims, 11 Drawing Sheets

LOG-SAMPLED FILTER SYSTEM

PRIORITY CLAIM

This application claims the benefit of U.S. Provisional Application No. 60/623,388, filed Oct. 29, 2004, which is incorporated herein by reference.

BACKGROUND OF THE INVENTION

1. Technical Field

This invention relates to digital filters and particularly to finite impulse response filters.

2. Related Art

Digital signal processing ("DSP") is used in a wide variety of devices, such as televisions, audio devices, hearing aids, computers and cellular phones. These devices employ DSP techniques to process signals in a variety of ways. For example, digital filtering techniques may be used to improve signal quality or to extract important information. In other cases, digital filters may be used to restore a signal that has been distorted in some way.

A digital filter, such as a finite impulse response ("FIR") filter, typically includes a number of equally spaced taps. Each tap is separated by a delay line and is multiplied by a filter coefficient. The output of each tap is added together and passed through a reconstruction filter. The filter coefficients allow the impulse response of the filter to be specified.

FIR filters designed to operate at high sample rates often require numerous taps to properly specify waveforms and frequency responses for wide-band signals, such as audio signals. These filters often provide an excessive amount of time or frequency resolution. For example, consider a signal with a bandwidth from 50 Hz to 20 kHz. To avoid aliasing, a sample rate for the signal would typically be selected that is greater than 40 kHz. Wile this high sample rate may be necessary for the high frequency components of the signal, linear sampling across all frequencies results in excessive sampling for the low frequency components. Furthermore, the high sample rate would typically result in a FIR filter with high complexity due to numerous filter coefficients needed to specify the impulse response.

Moreover, the high complexity of FIR filters often creates obstacles to implementation. For example, selection of the suitable filter coefficients to elicit a desired frequency response can be challenging. Filter designers typically employ specialized optimization software to select suitable filter coefficients. If the desired frequency response changes, the filter designer must go through the challenging process of selecting different filter coefficients, likely employing optimization software. These optimization techniques render real-time adjustments to the filter coefficients to meet changing desired frequency responses extremely difficult and costly in terms of processing resources.

Therefore, there exists a need for a FIR filter system particularly suited for filtering non-linearly sampled input signals, with enhanced capability for real-time adjustment of the frequency response.

SUMMARY

This invention provides a filter system. The filter system may be implemented with less hardware and software resources than traditional filters.

The filter processes non-linearly sampled signals with a structure that allows the filter frequency response to be specified in fewer samples. The frequency response of the filter system may be adjusted in real-time using a gain section of the system. The gain section may include a gain element associated with the real portion of the frequency spectrum and a gain element associated with the imaginary portion of the frequency spectrum. The gain elements may be calculated by dividing each point specified in the frequency response into the real and imaginary parts. This allows the gain elements to directly specify the frequency response of the filter system.

A multi-rate filter system includes an input channel configured to receive an input signal and an output channel configured to output a filtered signal. Multi-rate filter sections are coupled between the input channel and the output channel. Each multi-rate filter section may include a downsampler with a downsampler input and a downsampler output that is connected to a subsequent multi-rate filter section. A FIR filter channel coupled to the downsampler output may also be provided in the multi-rate filter section. The FIR filter channel may include a real FIR filter interpolator and an imaginary FIR filter interpolator coupled in parallel with the real FIR filter interpolator. A real gain element coupled to the real FIR filter interpolator and an imaginary gain element coupled to the imaginary FIR filter interpolator may also be included in the FIR filter channel. The system may include a summer connected to the real and imaginary gain elements and an upsampler connected to the summer. The upsampler may include an upsampler input and an upsampler output connected to either a prior multi-rate filter section or to an output signal summer.

A filtering method includes processing an input signal through multiple series connected multi-rate filter sections. The processing in at least one of the multi-rate filter sections includes downsampling the input signal to generate a reduced rate signal. The reduced rate signal may be filtered through a real FIR filter interpolator to generate a real FIR filter interpolator output. A real weight may be applied to the real FIR filter interpolator output to generate a real weighted filter output. The reduced rate signal may also be filtered through an imaginary FIR filter interpolator to generate an imaginary FIR filter interpolator output. An imaginary weight may be applied to the imaginary FIR filter interpolator output to generate an imaginary weighted filter output. The real weighted and imaginary weighted filtered outputs may be summed to generate an FIR channel output. The FIR channel output may be upsampled to generate an increased rate signal. The reduced rate signal may be provided to a subsequent multi-rate filter section. The increased rate signal may be provided to either a prior multi-rate filter section or to a output signal summer.

In another implementation, the filter system may include an input channel configured to receive an input signal and an output channel configured to output a filtered signal. Multiple FIR filter channels that implement a filter response may be provided. Each FIR filter channel may include a filter gain element coupled to the input channel. A real FIR filter interpolator and an imaginary FIR filter interpolator may also be included in each FIR filter channel. The FIR filter channels may be coupled to the input channel and to a signal summer. The signal summer may generate the filtered signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
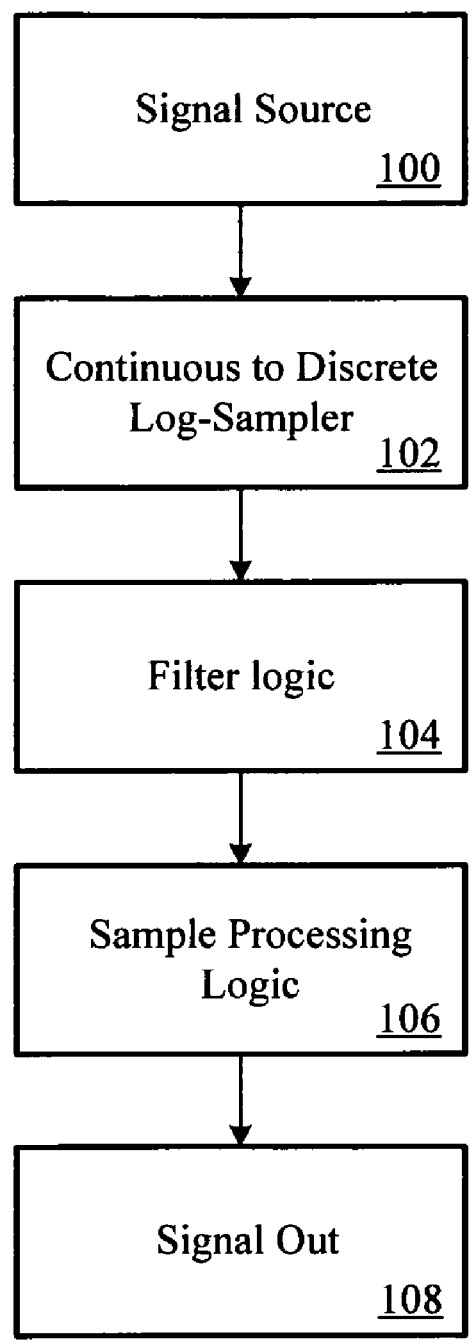
FIG. 1 is a block diagram of an example signal processing system with filter logic.

FIG. 1 shows an example signal processing system with filter logic. The system receives an input signal from a signal source 100. In many cases, the signal source 100 may provide a continuous signal, such as an electrical signal from a transducer. For example, where the signal source 100 provides a continuous signal, the system may sample the input signal with a continuous to discrete sampler 102. The sampler 102 converts the continuous signal into a discrete-time signal (i.e., digital signal).

The system may include a filter logic 104 configured to filter the discrete-time signal. For example, the filter logic 104 may be configured as a low pass, high pass, bandpass or other filter. The filter logic 104 may be implemented in hardware and/or software. However, the filter logic 104 may be implemented with less hardware and software resources than traditional filters. The filter logic 104 may include discrete logic or circuitry, a mix of discrete logic and a processor which executes instructions stored in a memory, or may be distributed over multiple processors or programs. The filter logic 104 may cooperate with sample processing logic 106 which further processes the sampled input signal, for example to perform speech recognition. The sample processing logic 106 may include discrete logic, a digital signal processor (DSP), microcontroller, or other processor. The filter logic 104 may be incorporated into communication devices, sound systems, gaming devices, signal processing software, or other devices and programs. The signal out 108 may be provided to any subsequent processing system, such as a voice recognition or audio reproduction system.

Figure 2:
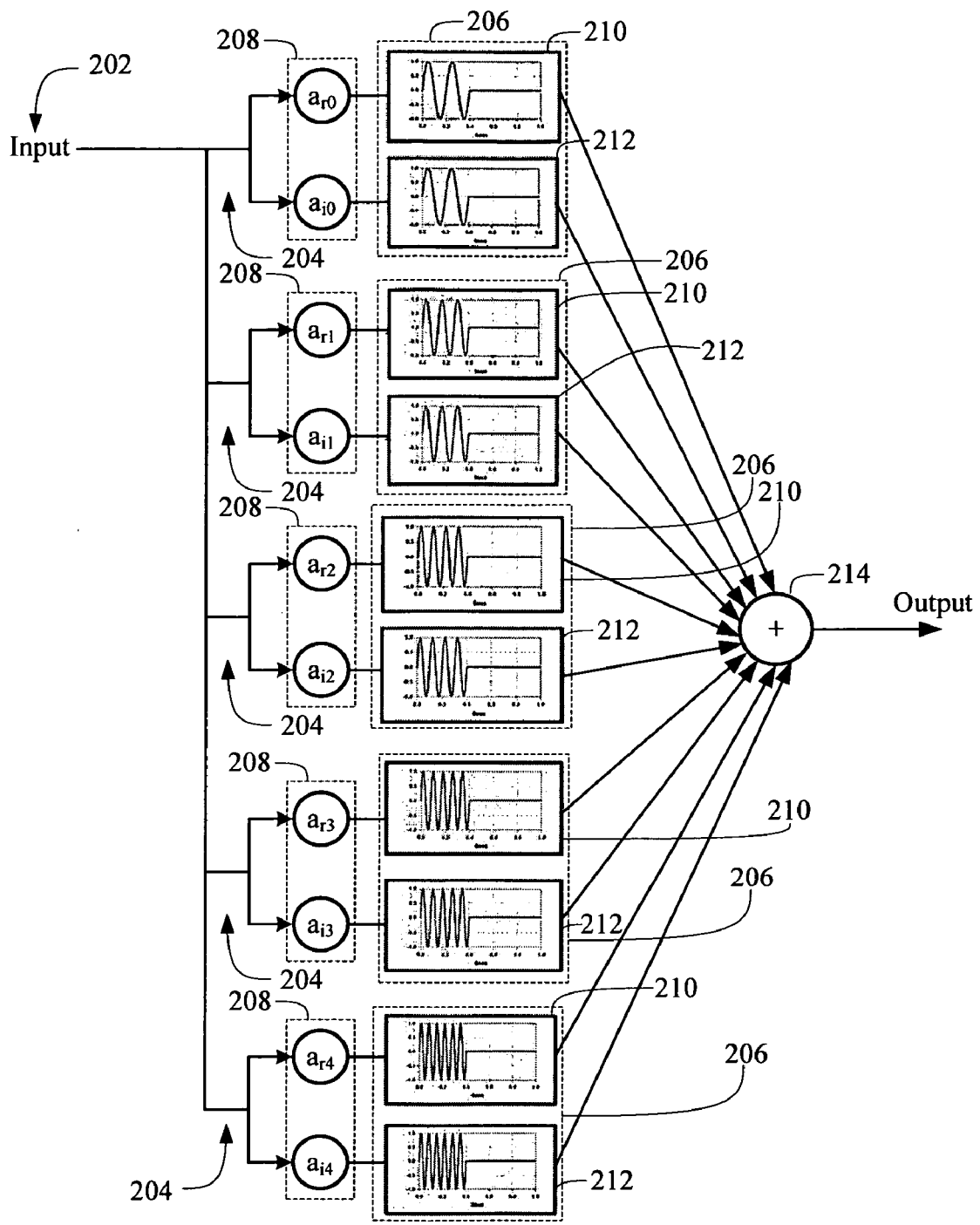
FIG. 2 is a block diagram of an example linear-sampled interpolation-in-frequency filter system.

FIG. 2 shows an example implementation of the filter logic 104 shown in FIG. 1. In the example shown, an input signal 202 is sent to multiple parallel processing channels 204. Each channel 204 includes a FIR filter section 206 and gain section 208. The FIR filter section 206 provides an interpolation function, which may be implemented as a cubic-spline interpolator or other tone burst, for example, as discussed below with respect to FIG. 3.

Each FIR filter section 206 includes a FIR filter interpolator 210 associated with the real portion of the frequency domain and a FIR filter interpolator 212 associated with the imaginary portion of the frequency domain. Although the FIR filter interpolators 210 and 212 have the same waveform in the example shown in FIG. 2, the waveform is shown for example purposes only, and the waveform for FIR filter interpolator 210 may be different than the waveform for FIR filter interpolator 212. The FIR filter interpolator 210 may be implemented with a cosine burst impulse response while the FIR filter interpolator 212 may implemented with a sine tone burst impulse response at the same frequency. Each FIR filter interpolator 210 is associated with a gain element (e.g., $a_{r0}$, $a_{r1}$, $a_{r2}$, $a_{r3}$ and $a_{r4}$) associated with the real portion of the spectrum while each FIR filter interpolator 212 is associated with a gain element (e.g., $a_{i0}$, $a_{i1}$, $a_{i2}$, $a_{i3}$ and $a_{i4}$) associated with the imaginary portion of the spectrum. A summer 214 outputs the sum of each channel 204. As shown, the input signal 202 passes first to an initial FIR filter channel, which includes the FIR filter section 206 associated with gain elements ($a_{r0}$ and $a_{i0}$) and the summer 214. The input signal also passes through three intermediate FIR filter channels and a final FIR filter channel.

As shown, each FIR filter's 212 impulse response is a constant-width tone burst. The frequency and phase of each burst depends on the location of the FIR filter interpolator in the complex frequency response. This form of FIR filter allows the filter's frequency response to be directly specified at a relatively small number of linear-spaced points in frequency. In the example shown, each channel is illustrated with a one second time-span FIR filter containing a 0.4 s constant-width tone burst of varying frequency. Five channels are illustrated covering a burst frequency range of 5 to 15 Hz with a step size of 2.5 Hz (=1/BurstWidth=1/0.4, the sample interval of the FIR filter). The FIR filters 212 are spaced equally in frequency at arbitrary values from $f_0$ to $f_n$. In some examples, the frequency interval may be arbitrarily lower than the sampling frequency of the hardware on which the filter is implemented.

Each coefficient $a_0$ to $a_4$ may set the level of the corresponding tone burst associated with a particular interpolation function in frequency. To calculate the gain elements associated with each channel, the frequency points in the desired frequency response may be converted to the real and imaginary parts. For purposes of example only, consider a desired frequency response specified by the following linear-spaced frequency points: 0 dB, 0 degrees at 100 Hz, 0 dB, 90 degrees at 200 Hz, −6 dB, −60 degrees at 300 Hz, 0 dB, −45 degrees at 400 Hz and −12 dB, 45 degrees at 500 Hz. Since the frequency response is specified by five frequency points, a five channel filter system may be used. The channels weights for this example can be calculated as follows:

1. First frequency point, 0 dB, 0 degrees at 100 Hz

Gain element associated with real portion of spectrum=$10^{\wedge}(0/20)*\cos$ (0 degrees)=1

Gain element associated with imaginary portion of spectrum=$10^{\wedge}(0/20)*\sin$ (0 degrees)=0

2. Second frequency point, 0 dB, 90 degrees at 200 Hz
Gain element associated with real portion of spectrum=10^(0/20)*cos (90 degrees)=0
Gain element associated with imaginary portion of spectrum=10^(0/20)*sin (90 degrees)=1
3. Third frequency point, −6 dB, 60 degrees at 300 Hz
Gain element associated with real portion of spectrum=10^(−6/20)*cos (−60 degrees)=0.25
Gain element associated with imaginary portion of spectrum=10^(−6/20)*sin (−60 degrees)=−0.43
4. Fourth frequency point, 0 dB, 45 degrees at 400 Hz
Gain element associated with real portion of spectrum=10^(0/20)*cos (−45 degrees)=0.71
Gain element associated with imaginary portion of spectrum=10^(0/20)*sin (−45 degrees)=−0.71
5. Fifth frequency point, −12 dB, 45 degrees at 500 Hz
Gain element associated with real portion of spectrum=10^(−12/20)*cos (45 degrees)=0.18
Gain element associated with imaginary portion of spectrum=10^(−12/20)*sin (45 degrees)=0.18

In contrast to a linear-sampled, interpolation-in-time filter system, a linearly-sampled, interpolation-in-frequency filter allows direct specification of the real and imaginary parts of the filter's frequency spectrum in linear frequency. With this type of filter, the frequency spectrum may be sampled much more sparsely than is typical with digital signal processing hardware. Effectively, the frequency response of the filter may be slowly varying in frequency due to the sparseness of the samples. Each linearly-interpolated sample in the filter's frequency response corresponds to a FIR filter channel whose impulse response is a tone burst at the frequency of the spectrum sample. The waveform of the burst is the inverse Fourier transform of the frequency-domain interpolation function. For linear sampling, the burst time of all the filter channels may be equal, with only the number of cycles in the burst changes.

Figure 3:
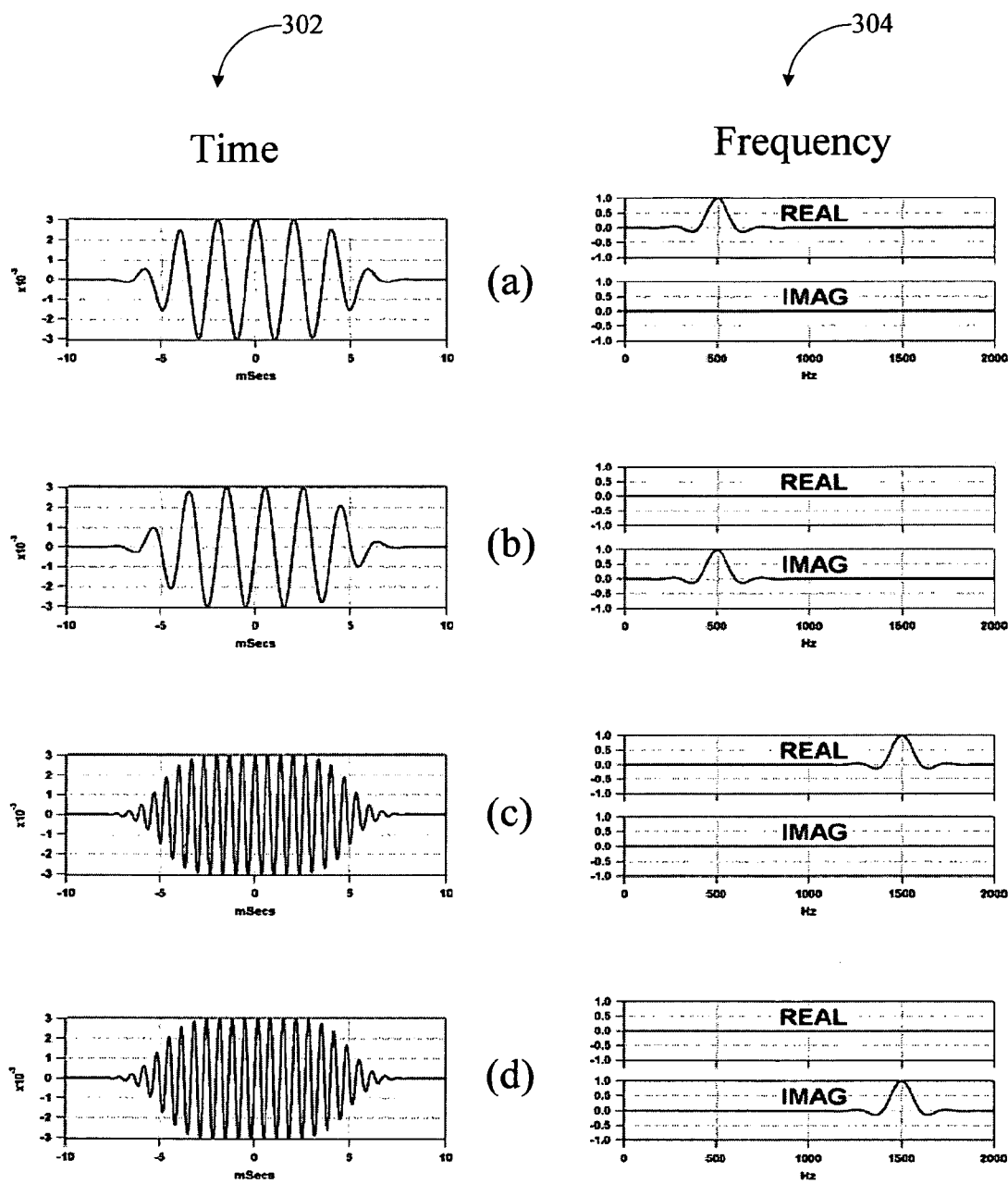
FIG. 3 is an example time response of a cubic-spline interpolator in linear frequency.

FIG. 3 shows an example implementation of a FIR filter section's tone burst. In this example, the tone burst is a cubic-spline interpolator in linear frequency with a time response 302 and a frequency response 304. In this example, a linear frequency scale of 0 to 2000 Hz (right) and linear time scale of −10 to +10 ms (left) is shown. The frequency sample rate in this example is 100 Hz (i.e., the interpolator steps in frequency every 100 Hz). Subpart (a) shows a 500 Hz interpolator in the real part of the spectrum. Subpart (b) illustrates a 500 Hz interpolator in the imaginary part of the spectrum. A 1,500 Hz interpolator in the real part of the spectrum is shown in subpart (c). Subpart (d) shows a 1,500 Hz interpolator in the imaginary part of the spectrum. In the example shown, the time burst width is constant, only the frequency and phase of the burst changes.

The impulse response of each channel 204 is a constant-frequency tone burst of arbitrary phase (complex) which is the time waveform corresponding to the interpolator at that specific burst frequency. The frequency of each tone burst at a particular channel is incremented at a step size which depends inversely on the duration of the burst. The tone burst is complex (real/imaginary or cosine/sine) because two FIR filter interpolators exist in the frequency domain, one for the real part of the frequency response and one for the imaginary part.

For illustration purposes, each burst is shown un-windowed. In some implementations, the actual bursts may exhibit an amplitude ramp up at the start and a ramp down at the end whose envelope shape depends on the chosen frequency-domain interpolator (as shown in the left column in FIG. 3). Alternately, the bursts may be formed by windowing a sine wave (of arbitrary phase) with a Tukey window which provides a half-Hann ramp-up and ramp-down to the start and end of the burst, respectively.

The linearly-sampled interpolation in frequency filter allows complex (real/imaginary or magnitude/phase) frequency responses to be directly specified in the frequency domain at linear-spaced points with far fewer samples than required by conventional FIR filters. The frequency, magnitude, and phase of the tone burst maps directly to the corresponding point in the frequency domain.

The FIR filter interpolator output is given by the following, which assumes continuous time operation:

$$y(t) = \sum_{n=0}^{N-1} a_n x(t) \otimes [\mathcal{F}^{-1}(H_{interp}(f_0 - n\Delta f))] \quad (2)$$

where x(t) is the input signal, y(t) is the system output signal, N is the number of channels, the $a_n$ are the amplitude coefficients of each channel, $H_{interp}$ is the frequency interpolation function, $f_0$ is the start frequency (may be an arbitrary value and need not be zero), $\nabla f$ is the sample frequency interval, $\mathcal{F}^{-1}$ is the inverse Fourier transform operator, and $\otimes$ is the convolution operator.

This type of filter includes in each channel the time waveform of an inverse Fourier transformed interpolation function in frequency. In this example, the time waveforms are essentially tone bursts of constant width of varying frequency and phase. For example, a ten-channel filter may be created that allows linear specification of a 0-to-20 kHz pass-band filter's frequency response in only ten equally-spaced 2 kHz spaced samples.

Figure 4:
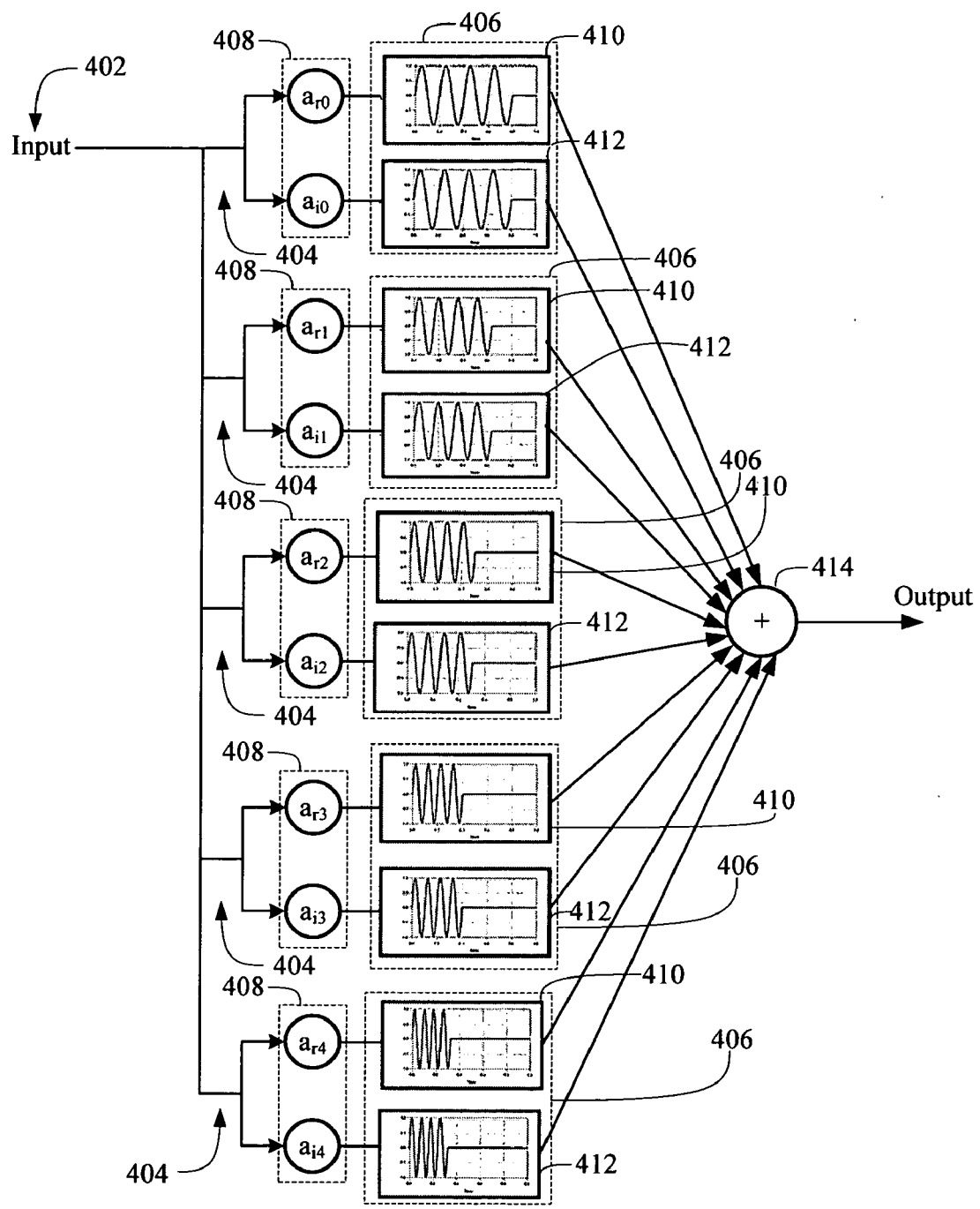
FIG. 4 is an example of a log-sampled interpolation-in-frequency filter system.
Figure 5:
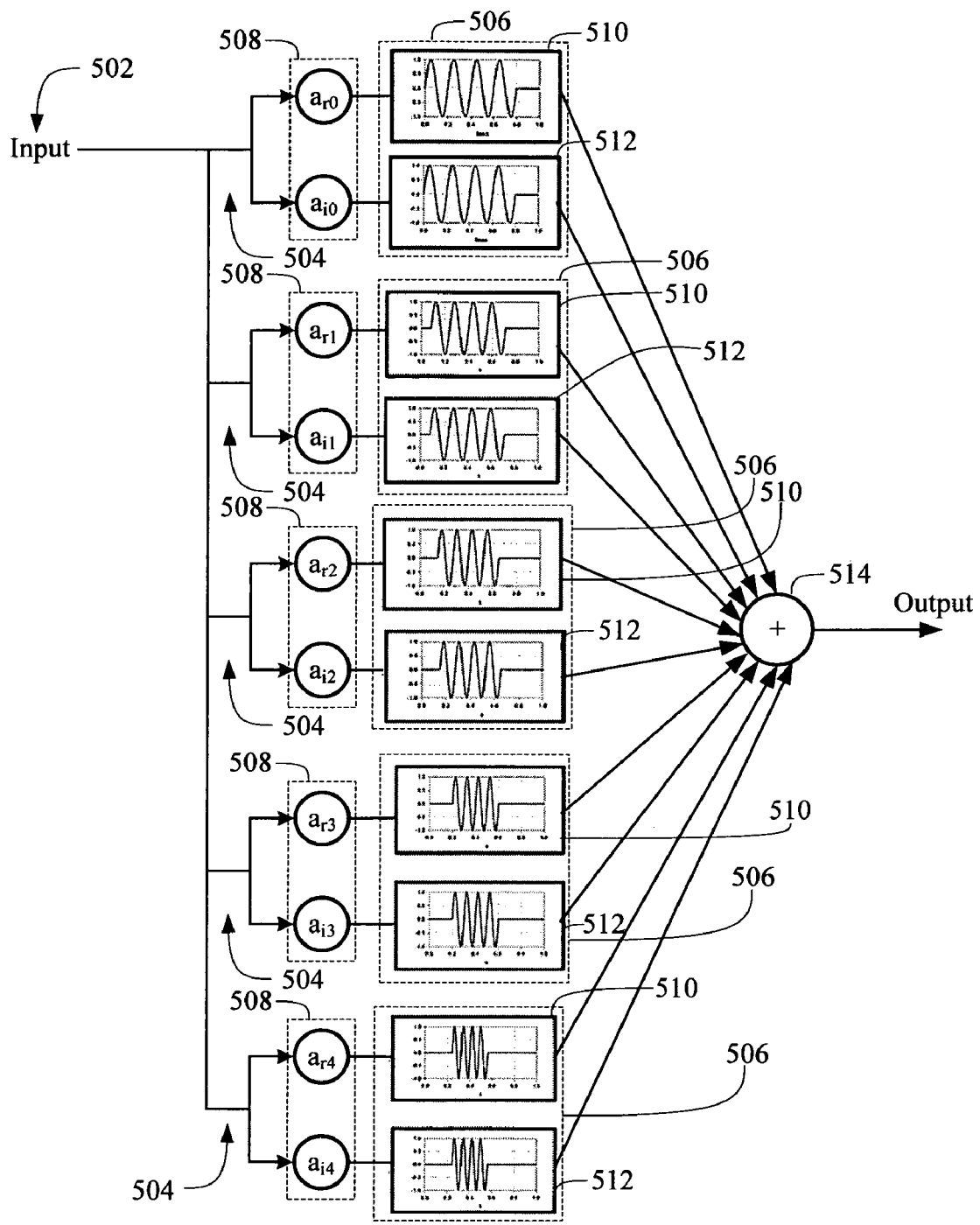
FIG. 5 is an example of a log-sampled interpolation-in-frequency filter system.

FIGS. 4 and 5 show example implementations of the filter logic 104 shown in FIG. 1. In FIG. 4, an input signal 402 is sent to multiple parallel processing channels 404. Each channel 404 includes a FIR filter section 406 and gain section 408. The FIR filter section 406 provides an interpolation function, which may be implemented as a cubic-spline interpolator or other tone burst, for example, as discussed below with respect to FIG. 6.

Each FIR filter section 406 includes a FIR filter interpolator 410 associated with the real portion of the frequency domain and a FIR filter interpolator 412 associated with the imaginary portion of the frequency domain. Although the FIR filter interpolators 410 and 412 have the same waveform in the example shown in FIG. 4, the waveform is shown for example purposes only, and the waveform for FIR filter interpolator 410 may be different than the waveform for FIR filter interpolator 412. The FIR filter interpolator 410 may be a cosine burst while the FIR filter interpolator 412 may be a sine tone burst of the same frequency. Each FIR filter interpolator 410 is associated with a gain element (e.g., $a_{r0}$, $a_{r1}$, $a_{r2}$, $a_{r3}$ and $a_{r4}$) associated with the real portion of the spectrum while each FIR filter interpolator 412 is associated with a gain element (e.g., $a_{i0}$, $a_{i1}$, $a_{r2}$, $a_{i3}$ and $a_{i4}$) associated with the imaginary portion of the spectrum. A summer 414 outputs the sum of each channel 404.

The input signal 402 passes first to an initial FIR filter channel, which includes the FIR filter section 406 associated with gain elements ($a_{r0}$ and $a_{i0}$) and the summer 414. The input signal also passes to three intermediate FIR filter channels and a final FIR filter channel. As shown, the start of the tone bursts in each FIR filter section 406 is aligned at zero.

In FIG. 5, an input signal 502 is sent to multiple parallel processing channels 504. Each channel 504 includes a FIR filter section 506 and gain section 508. Each FIR filter section 506 includes a FIR filter 510 associated with the real portion of the frequency domain and a FIR filter 512 associated with the imaginary portion of the frequency domain.

Although the FIR filter interpolators 510 and 512 have the same waveform in the example shown in FIG. 5, the waveform is shown for example purposes only, and the waveform for FIR filter interpolator 210 may be different than the waveform for FIR filter interpolator 512. The FIR filter interpolator 510 may be a cosine burst while the FIR filter interpolator 512 may be a sine tone burst of the same frequency. Each FIR filter interpolator 510 is associated with a gain element (e.g., $a_{r0}$, $a_{r1}$, $a_{r2}$, $a_{r3}$ and $a_{r4}$) associated with the real portion of the spectrum while each FIR filter interpolator 512 is associated with a gain element (e.g., $a_{i0}$, $a_{i1}$, $a_{i2}$, $a_{i3}$ and $a_{i4}$) associated with the imaginary portion of the spectrum. A summer 514 outputs the sum of each channel 504.

The input signal 502 passes first to an initial FIR filter channel, which includes the FIR filter section 506 associated with gain elements ($a_{r0}$ and $a_{i0}$) and the summer 514. The input signal also passes to three intermediate FIR filter channels and a final FIR filter channel. As shown, the tone bursts for each FIR filter section 506 is aligned at their centers.

In the examples shown in FIGS. 4 and 5, each FIR filter's impulse response is a variable-width tone burst with a constant number of cycles in each burst. The frequency and phase of each burst depends on the location of the FIR filter interpolator in the complex log frequency response. This form of FIR filter allows the filter's complex frequency response to be directly specified at a relatively small number of log-spaced points in frequency. Each channel is illustrated in the examples with a one second time-span FIR filter containing the variable-width tone burst of varying frequency. The illustrated bursts allow the log frequency response to be specified at one-tenth decade (essentially one-third octave) intervals with a sample ratio of $10^{0.1}=1.2589$. Five channels are illustrated with approximate log-spaced sample frequencies of 5, 6.3, 8, 10, and 12.5 Hz. The filter system may be extended to include as many channels as desired to process arbitrarily low frequencies.

The FIR filter interpolator output is given by the following equation which assumes continuous time operation:

$$y(t) = \sum_{n=0}^{N-1} a_n x(t) \otimes \left[ \mathcal{F}^{-1}\left( H_{interp}\left( N_e \ln\left( \frac{f}{r^n f_{min}} \right) \right) \right) \right]$$

where x(t) is the input signal, y(t) is the system output signal, N is the number of channels, the $a_n$ are the amplitude coefficients of each channel, $H_{interp}$ is the interpolation function, $N_e$ is the sample density, r is the ratio between successive sample times ($r=e^{1/N_e}$), $f_{min}$ is the sampling start frequency ($f_{min}>0$), $\mathcal{F}^{-1}$ is the inverse Fourier transform operator, and $\otimes$ is the convolution operator. Here the sampling stops (last frequency sample) at $f_{max}=r^{N-1}f_{min}$.

This type of FIR filter is conceptually similar to the previous linear FIR filter of FIG. 2, but each channel includes the time waveform of an inverse Fourier transformed log-warped interpolation function in frequency. Here however, the time waveforms are tone bursts of varying width and frequency but contain a constant number of cycles. This causes the bursts to be long at low frequencies and short at high frequencies. As before, because of the complex frequency response, the burst frequency and phase changes at each channel position. Not indicated in the previous equation is an energy normalization term that keeps the energy of the tone bursts constant as their width decreases. As an example, a 20-to-20 kHz pass-band one-third-octave equalizer may be created with only 31 log-spaced channels. In this example, the frequency step ratio is equal to the tenth root often ($f_{n+1}/f_n=10^{0.1}$).

Figure 6:
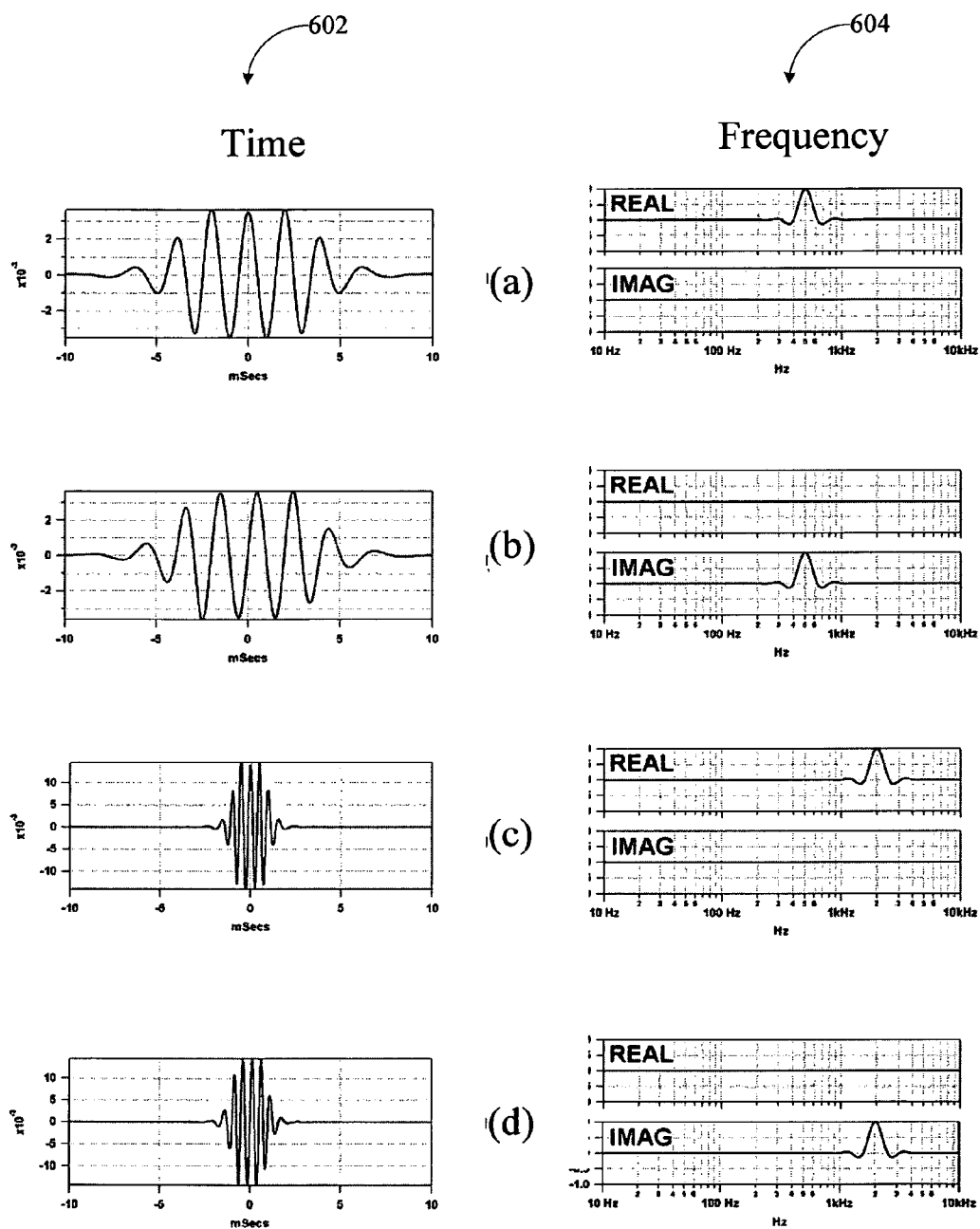
FIG. 6 is an example time response of a cubic-spline interpolator-in-log frequency.

FIG. 6 shows an example implementation of the tone burst of the FIR filter section 406 and 406 described in FIGS. 4 and 5. This example shows the time response 602 and frequency response 604 of a cubic-spline interpolator in log frequency. In this example, the log frequency scale of 10 Hz to 10 kHz (right) and the linear time scale of −10 to +10 ms (left) is provided. The frequency sample rate shown is 10 points per decade. In other words, in the example shown, the interpolator steps in frequency every one-tenth decade (about one-third of an octave). Subpart (a) is an example with a 500 Hz interpolator in the real part of spectrum. Subpart (b) provides an example with a 500 Hz interpolator in the imaginary part of spectrum. A 2,000 Hz interpolator in the real part of spectrum is shown in subpart (c). Subpart (d) provides an example with a 2,000 Hz interpolator in the imaginary part of spectrum. The time burst width may decrease as frequency increases, but may contain the same number of cycles. In other words, the waveform of the burst may stay the same and dilate or contract as the frequency shifts.

Figure 7:
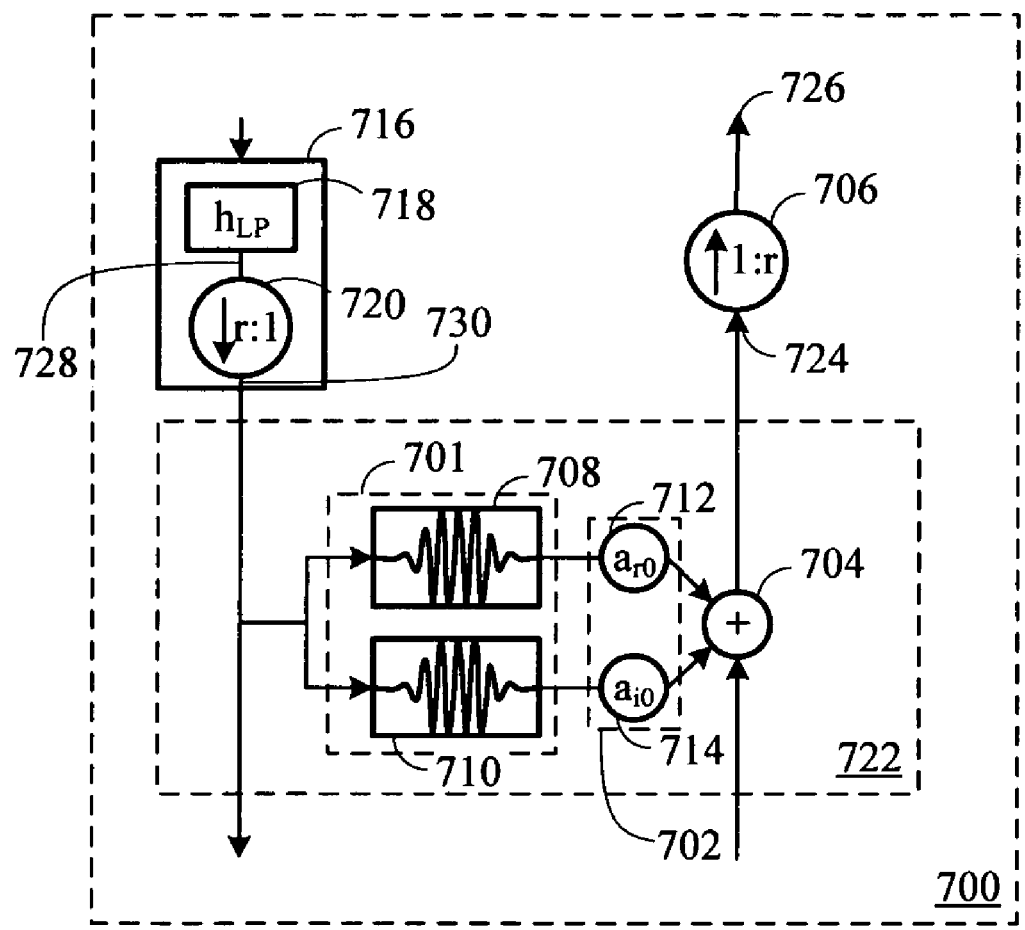
FIG. 7 is block diagram of an example multi-rate filter section that may be used in a multi-rate filter system.

The filter logic 104 of FIG. 1 may be implemented in a multi-rate structure. FIG. 7 shows an example of a multi-rate filter section 700 that may be implemented in such a multi-rate structure. The multi-rate filter section 700 includes a FIR filter channel 722 which includes a FIR filter section 701 and gain section 702. A summer 704 adds the output of the gain section 702. An upsampler 706 has an upsampler input 724 that is connected to the output of the summer 704. An upsampler output 726 may be connected to further processing logic and/or processing circuitry and/or other logic and/or circuitry. The upsampler 706 implements upsampling of the summer output at a rate of 'r'.

The filter section 701 may include a FIR filter interpolator 708 associated with the real portion of the frequency domain and a FIR filter interpolator 710 associated with the imaginary portion of the frequency domain. The FIR filter interpolator 708 may be a cosine tone burst while the FIR filter interpolator 710 may be a sine tone burst of the same frequency.

The gain section 702 includes the gain elements 712 and 714. The gain element 712 associated with the FIR filter interpolator 708 corresponds with a frequency point in the real portion of the spectrum while the gain element 714 associated with FIR filter interpolator 710 corresponds with the imaginary portion of the spectrum. The gain elements 712 and 714 adjust the magnitude of the output of their respective FIR filter interpolators.

An input processing element 716 precedes the FIR filter section. The input processing element 716 may include a low pass filter 718 connected to a downsampler input 728 of a downsampler 720. An output of the downsampler 730 is connected the filter section 701. The downsampler 720 implements downsampling of the input signal at a rate of 'r'.

Figure 8:
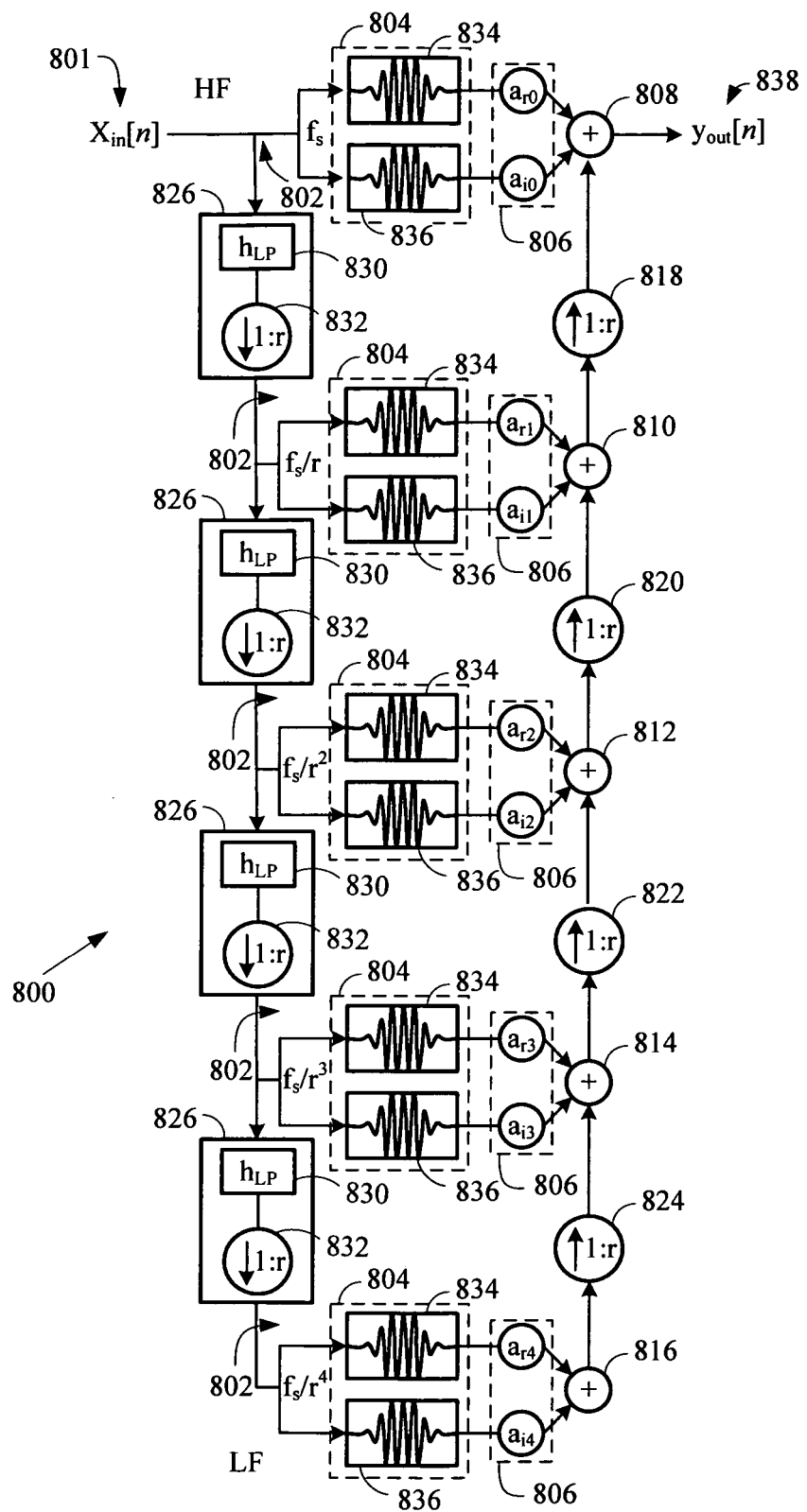
FIG. 8 is a block diagram of an example multi-rate log-sampled, interpolation-in-log filter system.

FIG. 8 shows a multi-rate filter system 800 which may implement the filter logic 104 shown in FIG. 1. The multi-rate filter system 800 implements multiple processing channels 802. An input signal $x_{in}$ is received on an input channel 801. Each channel includes a FIR filter section 804 and gain section 806. Summers 808, 810, 812, 814 and 816 add the output of the gain section 806. Upsamplers 818, 820, 822 and 824 are connected to the output of the summers 808, 810, 812, 814 and 816. The output of the final summer 808 is the output channel $y_{out}$ 838.

An input processing element 826 precedes each channel after the first channel. Each input processing element 826 may include a low pass filter 830 and a downsampler 832. The downsamplers 832 successively implement downsampling of the input signal at a rate of 'r'. The initial channel is not downsampled in the example shown and therefore is at the sample rate of the input signal, indicated by $f_s$. Since the first channel is not down sampled, the first channel has the highest sample rate, indicated by HF. The subsequent channels have successively lower sample rates, which are indicated by $f_s/r$, $f_s/r^2$, $f_s/r^3$, and $f_s/r^4$. As shown, the lowest sample rate is on the last channel, indicated by LF. The downsamplers 832 may be implemented in software or by integrated circuits, such as the Analog Devices AD1890, AD1891, AD1893, or AD1896 asynchronous sample rate converters.

Each channel of the filter section 804 has an impulse response that may be a complex tone burst. The complex tone burst may include a real portion and an imaginary portion of the frequency domain. Each channel includes a FIR filter interpolator 834 associated with the real portion of the frequency domain and a FIR filter interpolator 836 associated with the imaginary portion of the frequency domain. In some cases, the FIR filter interpolator 834 may be a cosine burst while the FIR filter interpolator 836 may be a sine tone burst of the same frequency. Either the real or imaginary portion of the complex tone burst may be calculated using the Hilbert-transform. In the example shown, the tone burst in the FIR filter interpolator 836 is the Hilbert-transformed 90°-phase-shifted version of the tone burst in the FIR filter interpolator 834. In the example shown, the tone burst in the FIR filter interpolator 834 for each channel is substantially the same. In some cases, the tone bursts of FIR filter interpolator 834 on each channel may be exactly the same. Likewise, the tone burst in each FIR filter interpolator 836 may be substantially the same or in some cases exactly the same.

The gain section 806 is associated with gain elements ($a_{r0}$, $a_{i0}$), ($a_{r1}$, $a_{i1}$) ... ($a_{rN}$, $a_{iN}$). The gain elements may multiply the output of the real and imaginary portions of the FIR filter section 804 to adjust the amplitude of each channel. Each channel corresponds to a frequency point in the frequency response of the multi-rate filter system 800. As examples, a frequency response specified by 5 frequency points may be implemented in a five channel filter system and a frequency response specified by 20 frequency points may be implemented with a 20 channel filter.

Each channel 802 may include two gain elements, with one gain element associated with the real FIR filter interpolator 834 and another gain element associated with the imaginary FIR filter interpolator 836. The gain element associated with FIR filter interpolator 834 corresponds with a frequency point in the real portion of the spectrum while the gain element associated with FIR filter interpolator 836 corresponds with the imaginary portion of the spectrum. For purposes of example only, consider a desired frequency response specified by the following log-spaced frequency points: 0 dB, 0 degrees at 100 Hz, 0 dB, 90 degrees at 200 Hz, −6 dB, −60 degrees at 400 Hz, 0 dB, −45 degrees at 800 Hz and −12 dB, 45 degrees at 1.6 kHz. A five channel multi-rate filter system may implement the frequency response specified by these five spectral points. To calculate the gain elements associated with each channel, the frequency point may be converted to the real and imaginary parts. For example, the channels weights for this example may be calculated as follows:

1. First frequency point, 0 dB, 0 degrees at 100 Hz

Gain element associated with real portion of spectrum=10^(0/20)*cos (0 degrees)=1

Gain element associated with imaginary portion of spectrum=10^(0/20)*sin (0 degrees)=0

2. Second frequency point, 0 dB, 90 degrees at 200 Hz

Gain element associated with real portion of spectrum=10^(0/20)*cos (90 degrees)=0

Gain element associated with imaginary portion of spectrum=10^(0/20)*sin (90 degrees)=1

3. Third frequency point, −6 dB, 60 degrees at 400 Hz

Gain element associated with real portion of spectrum=10^(−6/20)*cos (−60 degrees)=0.25

Gain element associated with imaginary portion of spectrum=10^(−6/20)*sin (−60 degrees)=−0.43

4. Fourth frequency point, 0 dB, 45 degrees at 800 Hz

Gain element associated with real portion of spectrum=10^(0/20)*cos (−45 degrees)=0.71

Gain element associated with imaginary portion of spectrum=10^(0/20)*sin (−45 degrees)=−0.71

5. Fifth frequency point, −12 dB, 45 degrees at 1.6 kHz

Gain element associated with real portion of spectrum=10^(−12/20)*cos (45 degrees)=0.18

Gain element associated with imaginary portion of spectrum=10^(−12/20)*sin (45 degrees)=0.18

Upsamplers 818, 820, 822 and 824 are provided to increase the sample rate on each channel. The sample rate may be increased to match the previous channel. The Upsamplers 818, 820, 822 and 824 successively implement upsampling at a rate of 'r'. As described above with respect to the downsamplers 832, the upsamplers 818, 820, 822 and 824 may be implemented by integrated circuits, such as the Analog Devices AD1890, AD1891, AD1893, or AD1896 asynchronous sample rate converters.

Summers 808, 810, 812, 814, 816 and 818 are provided to sum the output of the channels. The multi-rate filter system may be extended to include as many channels as desired to process arbitrarily low frequencies.

Figure 9:
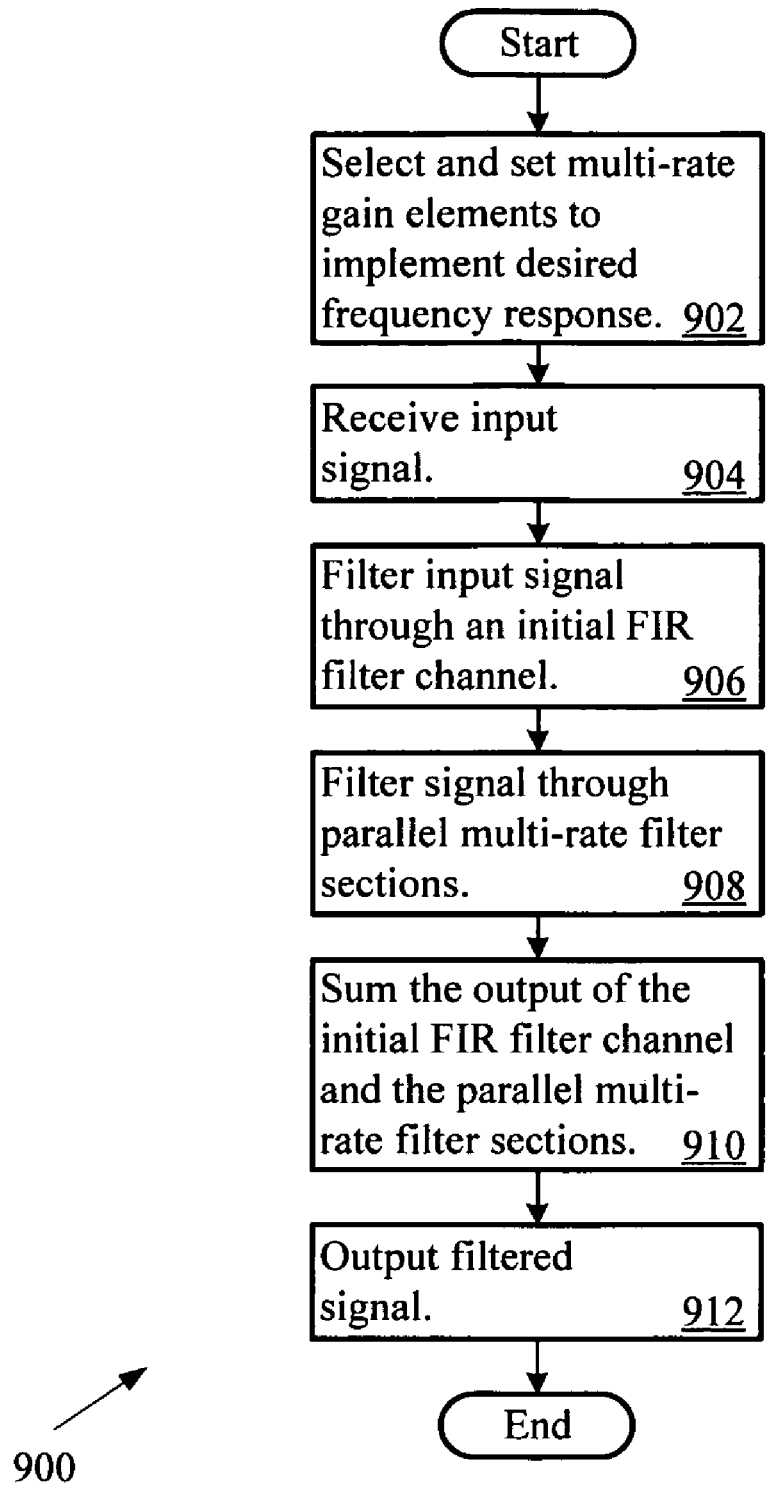
FIG. 9 is a flow diagram of the acts which the filter system may take to process a signal in a multi-rate filter system.

FIG. 9 is a diagram showing the acts 900 which may be taken by the filter system 800. Initially, the gain elements in the gain section 806 are set to implement the desired frequency response for the filter system (Act 902). The filter system 800 receives an input signal (Act 902). The filter system 800 applies the input signal to an initial FIR filter channel (Act 906). In addition, the filter system 800 applies the input signal to multiple parallel multi-rate filter sections 700 (Act 908). The output of each filter section and the initial filter channel is summed through successive sections as shown in FIG. 8 (Act 910). A filtered output signal 'y' results. The filter system 800 may then provide the filtered output signal to subsequent processing systems (Act 912).

Figure 10:
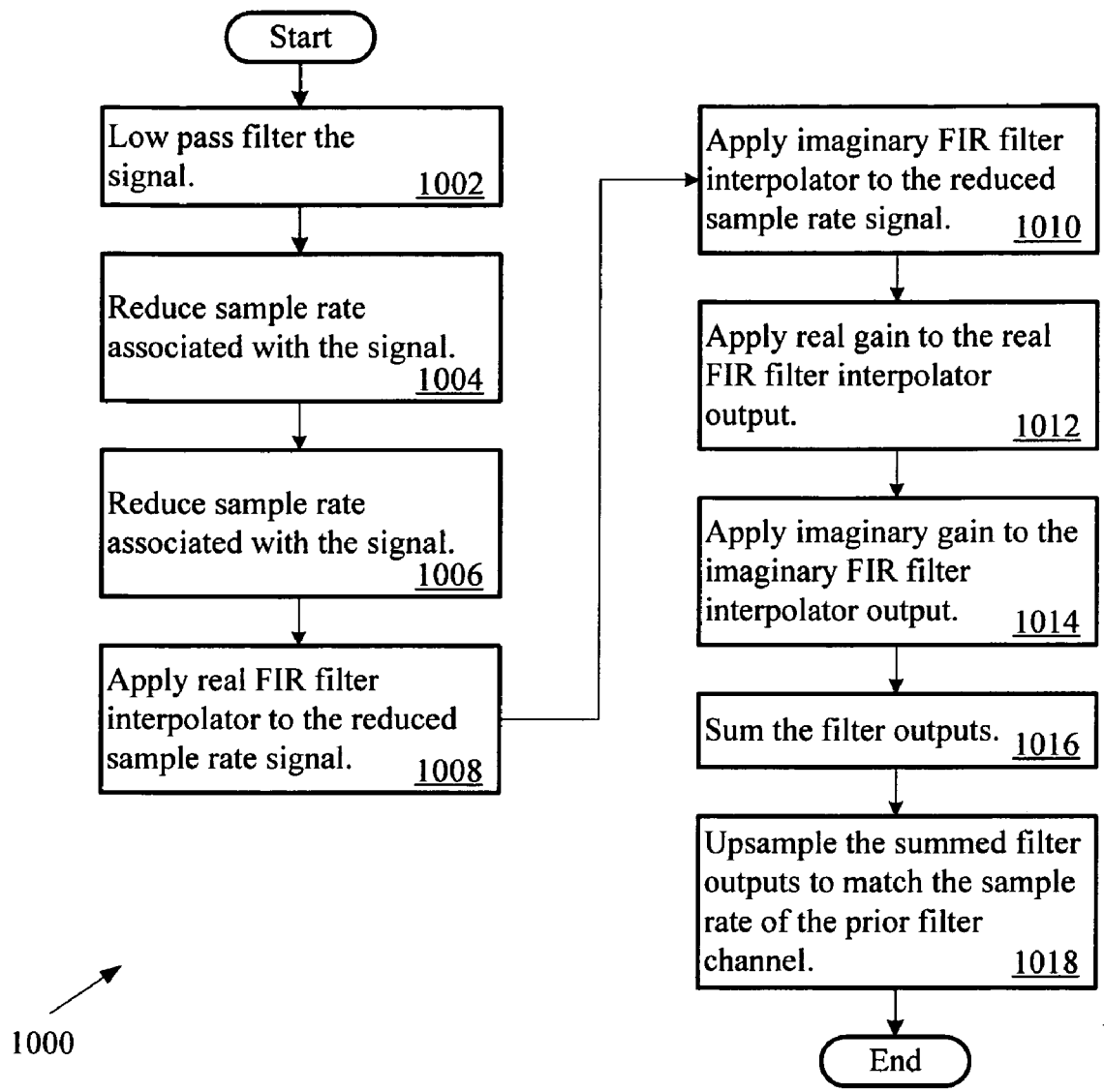
FIG. 10 is a flow diagram of the acts which the filter system may take to process a signal through a multi-rate filter section.

FIG. 10 shows the acts which a multi-rate filter section 700 may take to process the signal received by the filter section. The filter section 700 low pass filters the input signal (Act 1002). The fraction of frequencies (e.g., the lower one-half or lower one-quarter of frequencies) passed by the filter may correspond to the downsampling ratios subsequently applied.

The filter section 700 reduces the sample rate associated with each of the input signal (Act 1004). The filter section 700 applies a real FIR filter interpolator to the reduced sample rate signal (Act 1008). Similarly, the filter section 700 applies an imaginary FIR filter interpolator to the reduced sample rate signal (Act 1010).

The filter section 700 also applies a real filter gain to the output of the real FIR filter interpolator (Act 1012). An imaginary filter gain is also applied to the output of the imaginary FIR filter interpolator (Act 1014). The real gain and the imaginary gain may be directly set to specify the frequency response of the filter system 800.

After the real and imaginary gains are applied, the filter section 700 sums the outputs of the real and imaginary FIR filter interpolators (e.g., using the summer 704) (Act 1016). The filter section 700 then upsamples the summed output (Act 1018). For example, the filter section 700 may upsample the summed output to match the sample rate of a prior filter section. The filter section 700 then provides the upsampled signal to the prior filter section or the initial filter channel.

Figure 11:
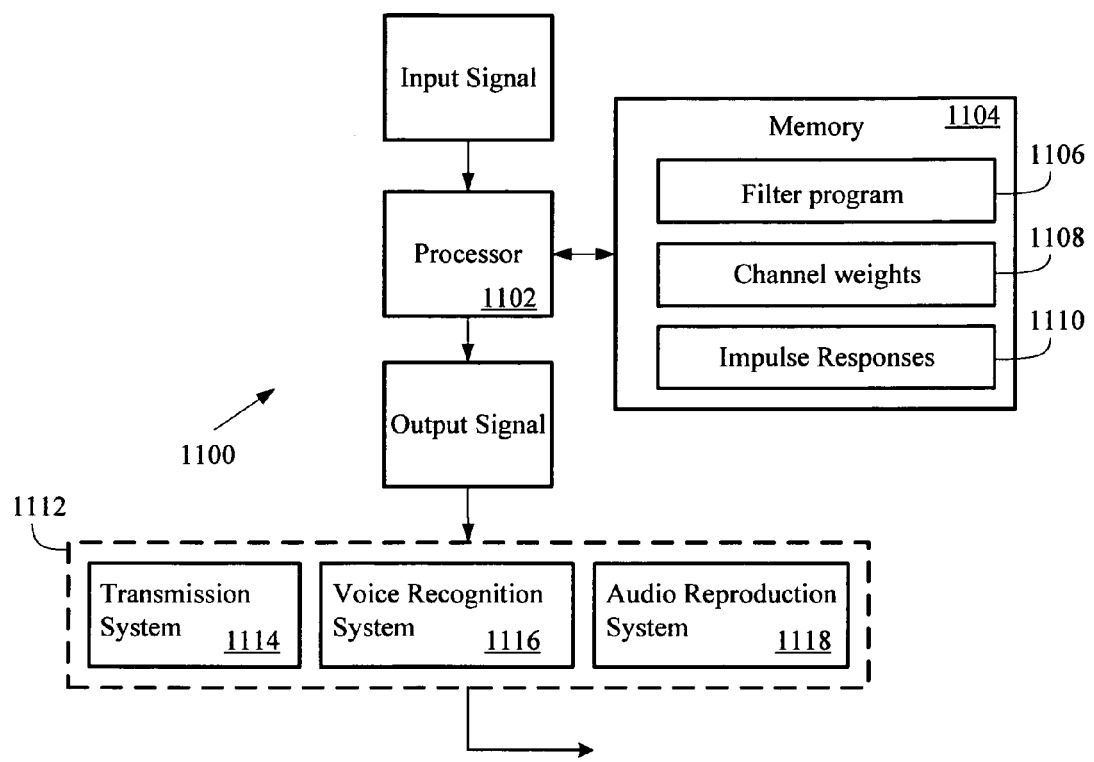
FIG. 11 is a block diagram of an example implementation of the signal processing system shown in FIG. 1.

FIG. 11 shows an example implementation 1100 of the filter logic 104. In this example, the system includes a processor 1102 connected to memory 1104. The processor 1102 may be any processor capable of executing machine readable instructions, such as a digital signal processor ("DSP"), microcontroller or other processor. The memory 1104 may be any machine readable medium, such as a disk, EPROM, flash card or other memory.

The memory 1104 may include a filter program 1106 which the processor 1102 executes. The filter 1106 may implement low-pass filtering, upsampling, downsampling, application of the real and imaginary FIR filter interpolators, signal summing, or any other processing act noted above. The memory 1104 may also store operational parameters for the filter system. For example, the memory 1104 may store real and imaginary FIR filter interpolator gains 1108, the interpolator impulse responses 1110, or any other parameters. The processor 1102 may change the parameters on the fly to reconfigure the filter system to operate according to any currently desired frequency response.

The processor 1102 is configured to receive an input signal. In some implementations the input signal may be received as digital data (e.g., as digital samples of a continuous time input signal). In other implementations, the processor 1102 may be communicate with an analog-to-digital converter which converts an analog input signal into digital data (e.g., at a non-linear sample rate). Upon receiving the input signal, the processor 1102 may execute the filter program 1106 to filter the input signal as desired.

The filter program 1106 may include instructions for processing the signal using any filtering implementation described above. In a multi-rate implementation, for example, the upsampling and/or downsampling may be performed by the processor 1102 executing instructions in the filter program 1106. An output signal, which has been processed according to the filter program 1106, may be provided as an output of the processor 1102.

The processor 1102 may also connect with post processing logic 1112. The post-processing logic 1112 may include, as examples, an audio reproduction system 1118, digital and/or analog data transmission systems 1114, or a voice recognition system 1116. The processor 1102 may provide the filtered output signal to any other type of post-processing logic.

The voice recognition system 1116 may include circuitry and/or logic that interprets, takes direction from, records, or otherwise processes voice. The voice recognition system 1116 may be process voice as part of a handsfree car phone, desktop or portable computer system, entertainment device, or any other system. In a handsfree car phone, the processor 1102 may be used in conjunction with the filter program 1106 to remove echo noise or otherwise remove undesired signal components in the output signal delivered to the voice recognition system 1116.

The transmission system 1114 may provide a network connection, digital or analog transmitter, or other transmission circuitry and/or logic. The transmission system 1114 may communicate filtered signals generated by the processor 1102 to other devices. In a car phone, for example, the transmission system 1114 may communicate filter signals from the car phone to a base station or other receiver through a wireless connection such as a ZigBee, Mobile-Fi, Ultrawideband, Wi-fi, or a WiMax network.

The audio reproduction system 1118 may include digital to analog converters, filters, amplifiers, and other circuitry or logic. The audio reproduction system 1118 may be a speech and/or music reproduction system. The audio reproduction system 1118 may be implemented in a cellular phone, car phone, digital media player/recorder, radio, stereo, portable gaming device, or other devices employing sound reproduction.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A multi-rate filter system comprising:
   an input channel configured to receive an input signal;
   an output channel configured to output a filtered signal;
   a plurality of multi-rate filter sections coupled between the input channel and the output channel, at least one of the multi-rate filter sections comprising:
   a downsampler including a downsampler input and a downsampler output connected to a subsequent multi-rate filter section;
   a finite impulse response (FIR) filter channel coupled to the downsampler output, the finite impulse response (FIR) filter channel comprising:
   a real finite impulse response (FIR) filter interpolator;
   an imaginary finite impulse response (FIR) filter interpolator coupled in parallel with the real finite impulse response (FIR) filter interpolator;
   a real gain element coupled to the real finite impulse response (FIR) filter interpolator; and
   an imaginary gain element coupled to the imaginary finite impulse response (FIR) filter interpolator;
   a summer connected to the finite impulse response (FIR) filter channel; and
   an upsampler connected to the summer, the upsampler comprising an upsampler input and an upsampler output connected to either a prior multi-rate filter section or to an output signal summer.

2. The multi-rate filter system of claim 1, where the real finite impulse response (FIR) filter interpolator comprises a tone burst impulse response.

3. The multi-rate filter system of claim 1, where the real finite impulse response (FIR) filter interpolator and the imaginary finite impulse response (FIR) filter interpolator each comprise a tone burst impulse response.

4. The multi-rate filter system of claim 3, the filter section further comprises a low pass filter prior to the downsampler.

5. The multi-rate filter system of claim 1, where the real finite impulse response (FIR) filter interpolator comprises a Cosine tone burst impulse response.

6. The multi-rate filter system of claim 1, where the imaginary finite impulse response (FIR) filter interpolator comprises a Sine tone burst impulse response.

7. The multi-rate filter system of claim 1, where the real finite impulse response (FIR) filter interpolator comprises a first impulse response and where the imaginary finite impulse response (FIR) filter interpolator comprises a second impulse response determined as a Hilbert transformed 90 degree phase shift of the first impulse response.

8. The multi-rate filter system of claim 1, further comprising an initial finite impulse response (FIR) filter channel coupled between the input channel and the output channel prior to the multi-rate filter sections.

9. The multi-rate filter system of claim 1, where the downsampler is a r:1 downsampler, where the upsampler is a 1:r upsampler, and where r is a sample rate.

10. The multi-rate filter system of claim 9, where the multi-rate filter sections non-linearly span an audio signal bandwidth.

11. The multi-rate filter system of claim 1, where each of the real gain element and the imaginary gain element specifies a portion of the filter response in log-spaced frequency.

12. The multi-rate filter system of claim 11, where a plurality of multi-rate filter sections comprise a finite impulse response (FIR) filter channel and each real finite impulse response (FIR) filter interpolator comprises a tone burst, and where each tone burst is identical.

13. The multi-rate filter system of claim 11, where a plurality of multi-rate filter sections comprise a finite impulse response (FIR) filter channel and each imaginary finite impulse response (FIR) filter interpolator comprises a tone burst, and where each tone burst is identical.

14. The multi-rate filter system of claim 1, where a plurality of multi-rate filter sections comprise a finite impulse response (FIR) filter channel and each real finite impulse response (FIR) filter interpolator comprises a tone burst, and where each tone burst is substantially the same.

15. A method of filtering a signal, the method comprising:
processing an input signal through a plurality of multi-rate filter sections, the processing in at least one of the multi-rate filter sections comprising:
downsampling to generate a reduced rate signal;
filtering the reduced rate signal through a real finite impulse response (FIR) filter interpolator and applying a real weight to the reduced rate signal to generate a real weighted filter output;
filtering the reduced rate signal through an imaginary finite impulse response (FIR) filter interpolator and applying an imaginary weight to the imaginary reduced rate signal to generate an imaginary weighted filter output;
summing the real weighted filter output and the imaginary weighted filtered output to generate a finite impulse response (FIR) channel output;
upsampling the finite impulse response (FIR) channel output to generate an increased rate signal;
providing the reduced rate signal to a subsequent multi-rate filter section; and
providing the increased rate signal to either a prior multi-rate filter section or to a output signal summer.

16. The method of claim 15, where the real finite impulse response (FIR) filter interpolator comprises a tone burst impulse response.

17. The method of claim 15, where the real finite impulse response (FIR) filter interpolator and the imaginary finite impulse response (FIR) filter interpolator each comprise a tone burst impulse response.

18. The method of claim 17, the filter section further comprises a low pass filter prior to the downsampler.

19. The method of claim 15, where the real finite impulse response (FIR) filter interpolator comprises a Cosine tone burst impulse response.

20. The method of claim 15, where the imaginary finite impulse response (FIR) filter interpolator comprises a Sine tone burst impulse response.

21. The method of claim 15, where the real finite impulse response (FIR) filter interpolator comprises a first impulse response and where the imaginary finite impulse response (FIR) filter interpolator comprises a second impulse response determined as a Hilbert transformed 90 degree phase shift of the first impulse response.

22. The method of claim 15, further comprising an initial finite impulse response (FIR) filter channel coupled between the input channel and the output channel prior to the multi-rate filter sections.

23. The method of claim 15, where the downsampling step is implemented by a r:1 downsampler, where the upsampling step is implemented by a 1:r upsampler, and where r is a sample rate.

24. The method of claim 23, where the multi-rate filter sections non-linearly span an audio signal bandwidth.

25. A machine readable medium comprising instructions executable by a processor, the machine readable medium comprising:
instructions to downsample and generate a reduced rate signal;
instructions to filter the reduced rate signal through a real finite impulse response (FIR) filter interpolator and apply a real weight to generate a real weighted filter output;
instructions to filter the reduced rate signal through an imaginary finite impulse response (FIR) filter interpolator and apply an imaginary weight to the imaginary finite impulse response (FIR) filter interpolator output to generate an imaginary weighted filter output;
instructions to sum the real weighted filter output and the imaginary weighted filtered output to generate a finite impulse response (FIR) channel output;
instructions to upsampling the finite impulse response (FIR) channel output to generate an increased rate signal;
instructions to provide the reduced rate signal to a subsequent multi-rate filter section; and
instructions to provide the increased rate signal to either a prior multi-rate filter section or to a output signal summer.

26. The machine readable medium of claim 25, where the real finite impulse response (FIR) filter interpolator comprises a tone burst impulse response.

27. The machine readable medium of claim 25, where the real finite impulse response (FIR) filter interpolator and the imaginary finite impulse response (FIR) filter interpolator each comprise a tone burst impulse response.

28. The machine readable medium of claim 25, where the real finite impulse response (FIR) filter interpolator comprises a Cosine tone burst impulse response.

29. The machine readable medium of claim 25, where the imaginary finite impulse response (FIR) filter interpolator comprises a Sine tone burst impulse response.

30. A filter comprising:
an input channel configured to receive an input signal;
an output channel configured to output a filtered signal;
multiple finite impulse response (FIR) filter channels which implement a filter response, the finite impulse response (FIR) filter channels coupled to the input channel and to a signal summer, where the signal summer generates the filtered signal, and where each of the finite impulse response (FIR) filter channels comprises:
a filter gain element;
a real finite impulse response (FIR) filter interpolator coupled to the filter gain element; and
an imaginary finite impulse response (FIR) filter interpolator coupled to the filter gain element.

31. The filter of claim 30, where the filter gain element specifies a portion of the filter response in linear frequency.

32. The filter of claim 31, where each of the real finite impulse response (FIR) filter interpolator and the imaginary finite impulse response (FIR) filter interpolator comprises a constant width tone burst impulse response.

33. The filter of claim 32, where each constant width tone burst impulse response has a different frequency.

34. The filter of claim 33, where the different frequencies are approximately equally spaced.

35. The filter of claim 30, where the filter gain element specifies a portion of the filter response in log-spaced frequency.

36. The filter of claim 35, where each of the real finite impulse response (FIR) filter interpolator and the imaginary finite impulse response (FIR) filter interpolator comprises a variable width tone burst impulse response.

37. The filter of claim 36, where each variable width tone burst impulse response has a different frequency.

38. The filter of claim 36, where each variable width tone burst impulse response comprises an equal number of cycles.

39. The filter of claim 36, where each variable width tone burst impulse response is initially aligned.

40. The filter of claim 36, where each variable width tone burst impulse response is centrally aligned.

41. The filter of claim 30, where each real finite impulse response (FIR) filter interpolator comprises a tone burst, and where each tone burst of each real finite impulse response (FIR) filter interpolator is substantially the same.

42. The filter of claim 41, where each tone burst of each real finite impulse response (FIR) filter interpolator is identical.

43. The filter of claim 30, where each imaginary finite impulse response (FIR) filter interpolator comprises a tone burst, and where each tone burst of each imaginary finite impulse response (FIR) filter interpolator is substantially the same.

44. The filter of claim 43, where each tone burst of each imaginary finite impulse response (FIR) filter interpolator is identical.

* * * * *

UNITED STATES PATENT AND TRADEMARK OFFICE
CERTIFICATE OF CORRECTION

PATENT NO.        : 7,555,081 B2                                      Page 1 of 1
APPLICATION NO.   : 11/263452
DATED             : June 30, 2009
INVENTOR(S)       : D. Broadus Keele, Jr.

It is certified that error appears in the above-identified patent and that said Letters Patent is hereby corrected as shown below:

In column 14, line 31, please delete "upsampling" and insert --upsample--.

Signed and Sealed this

Twenty-fifth Day of August, 2009

David J. Kappos
*Director of the United States Patent and Trademark Office*